United States Patent
Kiel et al.

(10) Patent No.: US 10,818,605 B2
(45) Date of Patent: Oct. 27, 2020

(54) ELECTRONIC POWER CIRCUITS COMPRISING BUS-BARS FORMING HEAT SINKS AND INTEGRATION METHOD

(71) Applicants: INSTITUT VEDECOM, Versailles (FR); ELVIA PCB, Coutances (FR)

(72) Inventors: Friedbald Kiel, Fontainebleau (FR); Olivier Belnoue, Ondreville-sur-Essonne (FR)

(73) Assignees: INSTITUT VEDECOM, Versailles (FR); ELVIA PCB, Coutances (FR)

( * ) Notice: Subject to any disclaimer, the term of this patent is extended or adjusted under 35 U.S.C. 154(b) by 0 days.

(21) Appl. No.: 16/470,501

(22) PCT Filed: Dec. 6, 2017

(86) PCT No.: PCT/FR2017/053407
§ 371 (c)(1),
(2) Date: Jun. 17, 2019

(87) PCT Pub. No.: WO2018/115624
PCT Pub. Date: Jun. 28, 2018

(65) Prior Publication Data
US 2020/0118933 A1 Apr. 16, 2020

(30) Foreign Application Priority Data

Dec. 19, 2016 (FR) .................................... 16 62803

(51) Int. Cl.
*H01L 23/48* (2006.01)
*H01L 23/538* (2006.01)
(Continued)

(52) U.S. Cl.
CPC .......... *H01L 23/5389* (2013.01); *H01L 24/25* (2013.01); *H01L 24/82* (2013.01);
(Continued)

(58) Field of Classification Search
CPC ......... H01L 23/34; H01L 23/36; H01L 23/46; H01L 23/473; H01L 23/5389; H01L 24/82; H01L 25/115
(Continued)

(56) References Cited

U.S. PATENT DOCUMENTS

| 7,504,720 | B2 * | 3/2009 | Nakatsu | ............... H01L 23/3675 |
| | | | | 257/712 |
| 8,125,781 | B2 * | 2/2012 | Mamitsu | ............... H01L 23/473 |
| | | | | 361/702 |

(Continued)

OTHER PUBLICATIONS

International Search Report for PCT/FR2017/053407 dated Jun. 19, 2018.
Written Opinion for PCT/FR2017/053407 dated Jun. 19, 2018.

*Primary Examiner* — Nitin Parekh
(74) *Attorney, Agent, or Firm* — Sandberg Phoenix & von Gontard, P.C.

(57) ABSTRACT

The circuit comprises at least one electronic chip (MT, MD), a laminated substrate and heat sink means, the chip being implanted in the substrate and the heat sink means being secured to opposing faces of the substrate. According to the invention, the heat sink means comprise heat-sink-forming bus-bars ($BB_H$, $BB_L$) mounted on the opposing faces of the substrate, each of said bus-bars being formed by a plurality of metal segments ($BB1_H$, $BB2_H$, $BB3_H$, $BB4_H$; $BB1_L$, $BB2_L$, $BB3_L$) secured at spaced-apart positions and interconnected with one another and with a contact face of the electronic chip (MT, MD) by means of a metal layer ($ME_H$, $ME_L$).

10 Claims, 7 Drawing Sheets

(51) Int. Cl.
*H01L 23/00* (2006.01)
*H01L 25/11* (2006.01)
*H01L 23/473* (2006.01)

(52) U.S. Cl.
CPC .......... *H01L 25/115* (2013.01); *H01L 25/117* (2013.01); *H01L 23/473* (2013.01); *H01L 2224/2518* (2013.01)

(58) Field of Classification Search
USPC ........................................ 257/774, 713, 714
See application file for complete search history.

(56) References Cited

U.S. PATENT DOCUMENTS

| | | | | |
|---|---|---|---|---|
| 8,946,889 B2* | 2/2015 | Katou | ................... | H01L 21/565 257/713 |
| 9,041,183 B2* | 5/2015 | Liang | ................... | H01L 25/072 257/691 |
| 2008/0224303 A1* | 9/2008 | Funakoshi | ............ | H01L 23/473 257/701 |
| 2008/0305582 A1* | 12/2008 | Fillion | .................. | H01L 25/072 438/118 |
| 2009/0224398 A1* | 9/2009 | Noritake | ............... | H01L 23/051 257/707 |
| 2011/0012252 A1* | 1/2011 | Gao | ...................... | H01L 25/071 257/698 |
| 2011/0316142 A1* | 12/2011 | Noritake | ............... | H01L 23/051 257/713 |
| 2012/0119347 A1* | 5/2012 | Mamitsu | ............... | H01L 23/473 257/698 |
| 2013/0020694 A1* | 1/2013 | Liang | .................... | H01L 25/072 257/691 |
| 2015/0255380 A1* | 9/2015 | Chen | .................. | H01L 23/49827 361/707 |
| 2016/0133558 A1 | 5/2016 | Stahr et al. | | |

\* cited by examiner

ELECTRONIC POWER CIRCUITS COMPRISING BUS-BARS FORMING HEAT SINKS AND INTEGRATION METHOD

CROSS-REFERENCE TO RELATED APPLICATIONS

The present application is the US National Stage under 35 USC § 371 of International Application No. PCT/FR2017/053407, filed 6 Dec. 2017 which claims priority to French patent application 1662803 filed on 19 Dec. 2016, the content of which (text, drawings and claims) is incorporated here by reference.

BACKGROUND

The invention relates generally to the field of power electronics. More particularly, the invention relates to an electronic power circuit comprising bus bars forming heat sinks. The invention also relates to a device comprising a plurality of these circuits and to a method of incorporating electronic power chips and of interconnecting bus bars to produce these circuits.

Electronic power devices, such as power converters, are very widespread in numerous fields of activity such as transport, industry, lighting, heating, etc. Given the desired energy transition towards renewable energy sources that produce fewer $CO_2$ emissions, power electronics is becoming even more widespread and will have to respond to growing economic and technological constraints.

Current research and development focuses on cost reduction, increasing power density, increasing reliability, reducing parasitic elements and heat transfer of dissipated energy.

In the present state of the art, high density interconnect (HDI) technology is commonly used to increase the level of integration and reduce the size of power circuits. The HDI technology generally implemented on printed circuit boards (PCB) is based on optimizing the spatial implantation of components using in particular strips and ceramic plates carrying a copper trace circuit, known as a 'lead frame', to interconnect surface-mounted components or, in a more advanced technology, micro-holes, known as 'microvias', filled with copper to interconnect embedded components. Laser drilling is used as well as different soldering techniques such as brazing, transient liquid phase (TLP) bonding or metal nanoparticle powder sintering.

However HDI technology is reaching its limits given the cost reductions required for mass production, and the increased level of integration and compactness. The volume occupied by the interconnections with strips and microvias limits the level of integration that can be achieved. Interconnections with strips or cables introduce parasitic inductances which are not compatible with higher quench or commutation frequencies. However the increase in commutation frequencies generally favors compactness, notably in power converters. A reduction in parasitic inductances is also necessary to reduce the heat generated, to protect the circuits against potentially destructive voltage surges and to improve control of electromagnetic radiation.

High-performance cooling is necessary to maintain the temperatures of the active and passive components below critical values, to reach thermal equilibrium and to guarantee the reliability of the power circuits. The availability of silicon chips with increasingly small surface areas and new power semiconductors, such as silicon carbide, allows higher current densities and an increase in quench frequency, which permits even greater power circuit compactness. But to do this, the architecture of the power circuits and the technology used must provide extraction of the dissipated energy as close as possible to the components. The thermal path between the heat sources formed by the components and the heat sinks formed by the thermal dissipation means must be optimized.

In known technologies, heat must pass through different layers such as the solder, the copper-plated dielectric substrate, the metal base plate, the thermal interface material and the mass of the heat sink, before being transferred into the air or into a coolant.

It now seems necessary to propose a novel technology for the manufacture of electronic power devices with superior heat dissipation performance that allow greater optimization in relation to the various constraints that apply.

BRIEF SUMMARY

According to a first aspect, an electronic power circuit is disclosed comprising at least an electronic chip, a laminated substrate formed of insulating and conductive layers and thermal dissipation means, the electronic chip being implanted in the substrate and the thermal dissipation means being secured to opposite first and second faces of the substrate. The thermal dissipation means comprises heat-sink-forming first and second bus bars mounted respectively on the opposite first and second faces of the substrate, the first and second bus bars each being formed of a plurality of metal bus bar segments secured at predetermined spaced-apart positions and interconnected with each other and with a contact face of the electronic chip by a layer of metal.

According to a particular characteristic of the circuit, the bus bar segments are secured to first and second opposite faces of the substrate through dielectric layers.

According to another particular characteristic, at least one of the bus bar segments is secured to an electrode of the chip through a dielectric layer.

According to yet another particular characteristic, the bus bar segments and the conductive layers and metal layers of the circuit are made of copper.

According to another aspect, an electronic power device comprises at least two circuits as described briefly above, a first circuit known as the 'high side' circuit being stacked on a second 'low side' circuit, the high side and low side circuits being connected mechanically and electrically by the respective bus bars thereof, and comprising at least one central coolant circulation space which is situated between the high side and low side circuits, the central coolant circulation space being formed between bus bar segments.

According to a particular characteristic, the device also comprises at least an upper coolant circulation space which is situated in an upper portion of the device, the upper coolant circulation space being formed between segments of an upper bus bar of the upper circuit and an upper dielectric layer.

According to another particular characteristic, the device also comprises at least one lower coolant circulation space which is situated in a lower portion of the device, the lower coolant circulation space being formed between segments of a lower bus bar of the lower circuit and a lower dielectric layer.

According to another particular characteristic, the device comprises at least one control circuit secured to an upper portion or a lower portion of the device through a dielectric layer.

According to yet another aspect, a method of incorporating electronic power chips and heat-sink-forming bus bars to produce an electronic power circuit as described briefly above is disclosed. The method comprises:

produce a blank incorporating at least one electronic chip comprised between internal laminated insulating and/or conductive layers;

mechanically attaching, by means of dielectric portions of resin prepreg, metal bus bar segments at predetermined spaced-apart positions on opposite upper and lower faces of the blank; and for each of the opposite upper and lower faces, interconnecting by metal layer deposition of the bus bar segments secured to the face in question and a contact face of the electronic chip, thus forming the electronic power circuit comprising heat-sink-forming bus bars.

According to a particular characteristic, the method comprises steps of lamination, removal of material by ablation, electro-deposition and photolithography.

DESCRIPTION OF THE FIGURES

Other advantages and characteristics of the device and method will appear more clearly on reading the detailed description below of a plurality of particular embodiments of the invention, with reference to the accompanying drawings, in which.

DETAILED DESCRIPTION

A particular embodiment of the method will now be described above in relation to the embodiment of an electronic power device or module in the form of a transistor commutation bridge, or half-bridge, arm. Conventionally, the bridge arm comprises an upper transistor and a lower transistor, known respectively as the 'high side' and 'low side' transistors, and associated diodes. Such devices may be linked to form complete commutation bridges or linked in parallel to pass the required current.

In general, known and well-understood printed circuit manufacturing techniques for incorporating electronic chips are used in the method. Thus, the method may use a combination of different manufacturing techniques including lamination, laser ablation, photolithography, electrolytic metal deposition and wet etching. Electrolytic metal deposition may in particular be used to interconnect electronic chips and bus bars.

The different manufacturing steps in the method of incorporating electronic power chips and interconnecting bus bars will now be described with reference to FIGS. 1 to 15.

Figure 1:
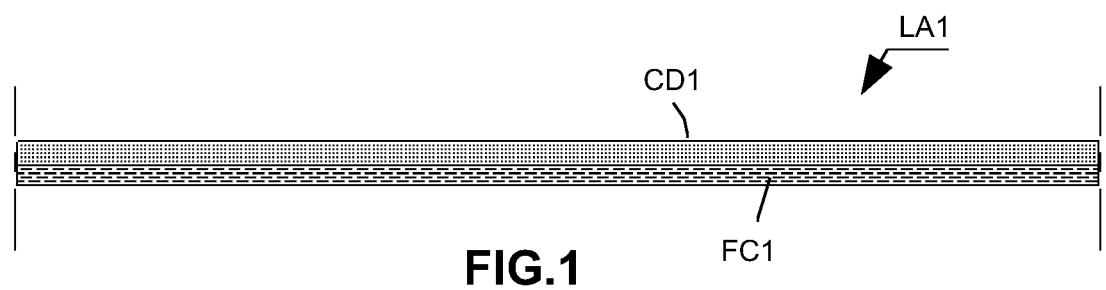
FIGS. 1 to 15 are simplified views in cross section showing the steps of the method of incorporating electronic power chips and heat-sink-forming bus bars.
Figure 2:
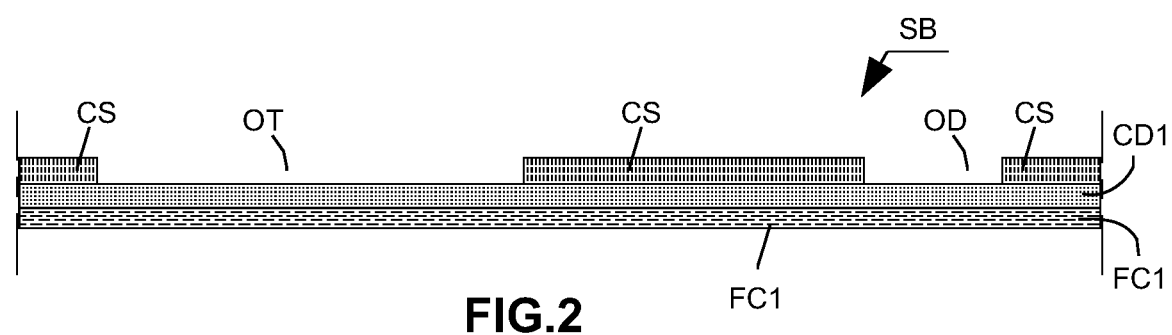

FIGS. 1 and 2 show an initial step of manufacturing a base substrate SB comprising cavities to receive electronic chips.

The substrate SB is produced from a laminate LA1 on which dielectric portions CS are deposited.

The laminate LA1 is formed of a dielectric layer CD1 which is secured to a conductive metal foil FC1 typically made of copper. The layer CD1 is typically a step B (i.e. an intermediate polymerization step) dielectric layer made up of glass fibers and an epoxy resin. In a variant, an organic laminate or a copper-clad laminate (CCL) may also be used.

The dielectric portions CS are previously cut and transferred to the dielectric layer CD1 to form cavities OT and OD. The dielectric portions CS are typically formed of a step C (i.e. fully polymerized) dielectric layer, made up of glass fibers and an epoxy resin.

Figure 3:
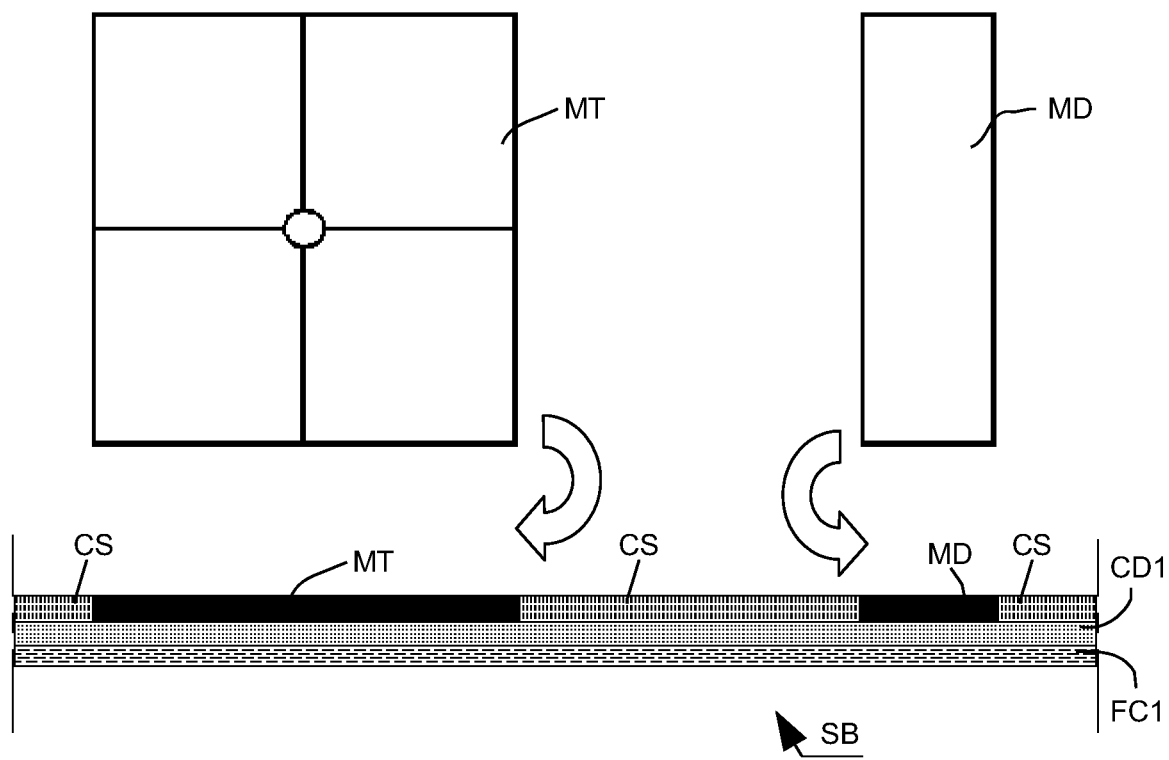

In the step in FIG. 3, component chips, for example, in the form of a power transistor MT and a diode MD, are positioned in the cavities OT and OD of the substrate SB.

Figure 4:
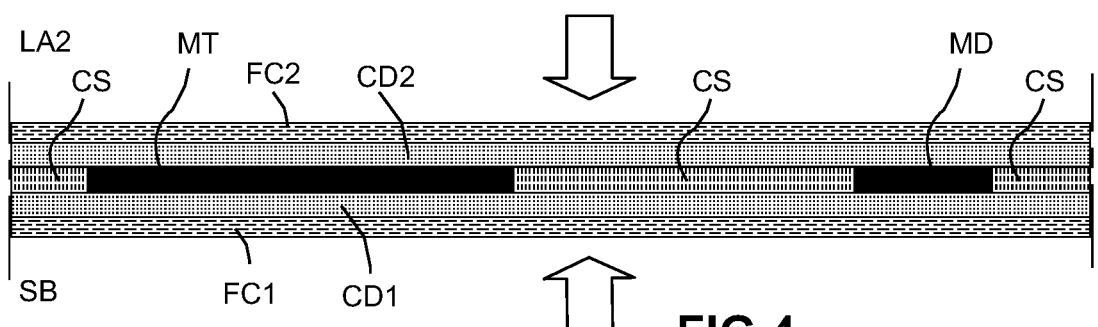

The step in FIG. 4 shows the deposition on the substrate SB, which carries the chips MT and MD, of another laminate LA2, similar to the laminate LA1 of FIG. 1. The laminate FA2 comprises a conductive metal foil FC2, made of copper, and a dielectric layer CD2.

At this stage, the dielectric layers CD1 and CD2 are still only partly polymerized. The chips MT and MD are sandwiched between the dielectric layers CD1 and CD2. Lamination of LA2 on the substrate SB is typically achieved by pressing and passing through a vacuum-laminating oven.

Figure 5:
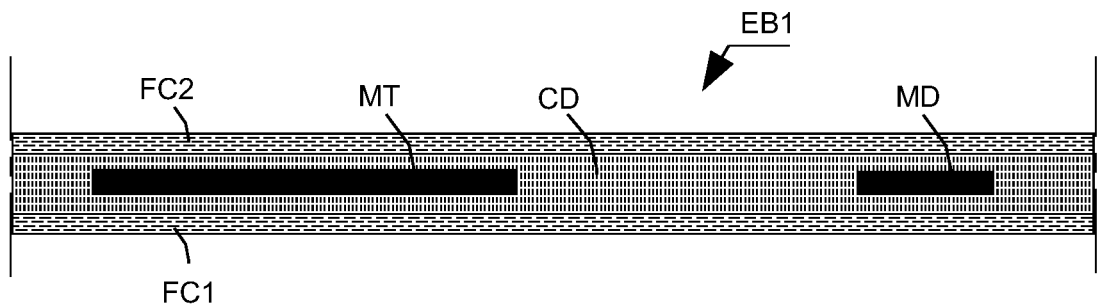

On coming out of the vacuum-laminating oven, in FIG. 5, a blank EB1 is obtained in which the chips MT and MD are buried in a fully polymerized dielectric layer CD originating from the lamination of the layers CD1, CS and CD2. The copper foils FC1 and FC2 form opposite upper and lower faces of the blank EB1.

Figure 6:
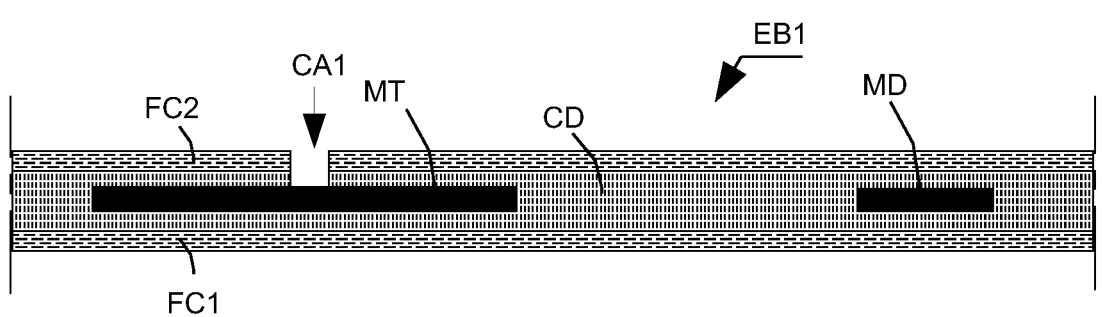

In the step in FIG. 6, material removal operations, for example by laser ablation, are carried out on the blank EB1 to produce fine metallic chip connection patterns. As shown in FIG. 6, a cavity CA1 is produced in this case on the upper face of the blank EB1 so as to release a control electrode of the chip MT. The chip MT is in this case a MOS-FET power transistor for example and the control electrode which is released is the transistor gate electrode.

Figure 7:
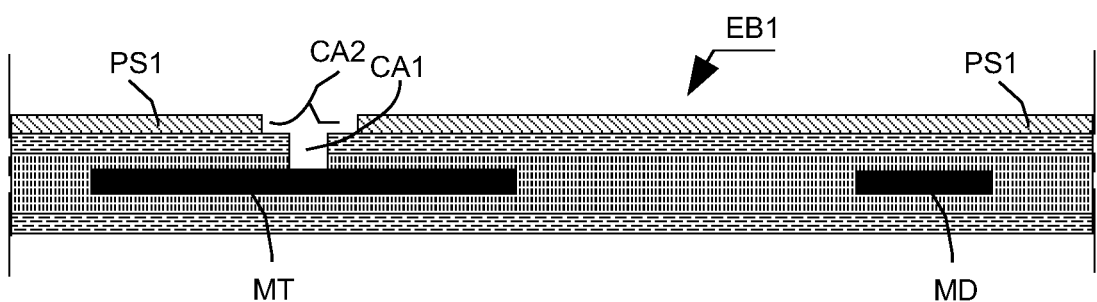

The step in FIG. 7 shows a photoresist masking resin PS1 which has been coated on the upper face of the blank EB1. A portion CA2 of the resin has been released conventionally using a screen-printing mask and exposure to ultraviolet radiation. The clearances CA1 and CA2 are intended to produce a contact block and a connection coating on the strip for the control electrode of the chip MT.

Figure 8:
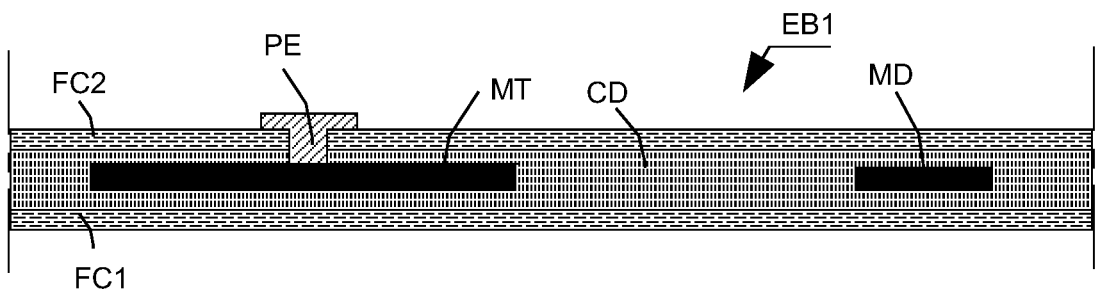

FIG. 8 shows the contact block PE of the control electrode of the chip MT at an intermediate stage of production, after removal of the masking resin PS1 by a known method such as oxygen plasma treatment, dry stripping or using a solvent, for example. The contact block PE is produced on the blank EB1 by electrolytic deposition of a metal, typically copper, in the clearances CA1 and CA2 shown in FIG. 7.

Figure 9:
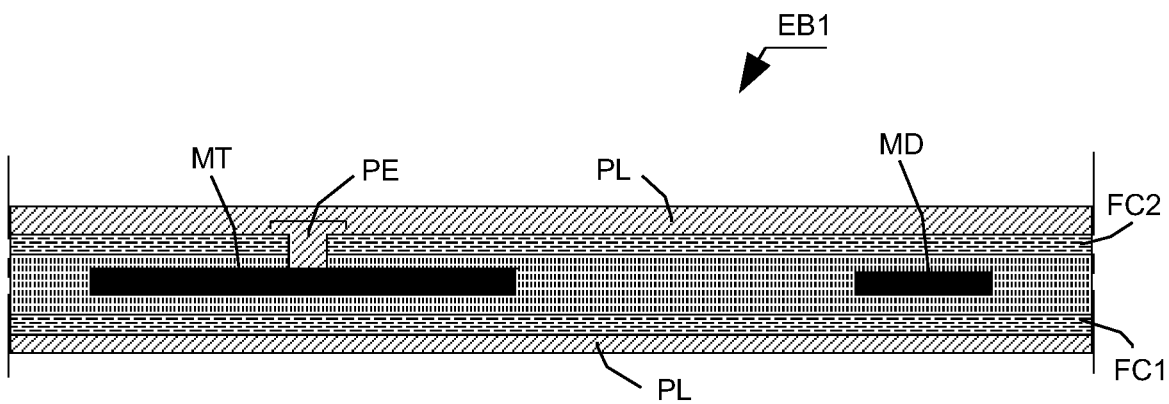

In the step in FIG. 9, copper electrolytic deposition is carried out in order to planarize the upper and lower faces of the blank EB1. The upper face of the blank EB1, made of copper foil FC2 and the electrode contact block PE, is covered with a copper planarization layer PL. The lower face of the blank EB1, made of copper foil FC1, is also covered with a copper planarization layer PL.

Figure 10:
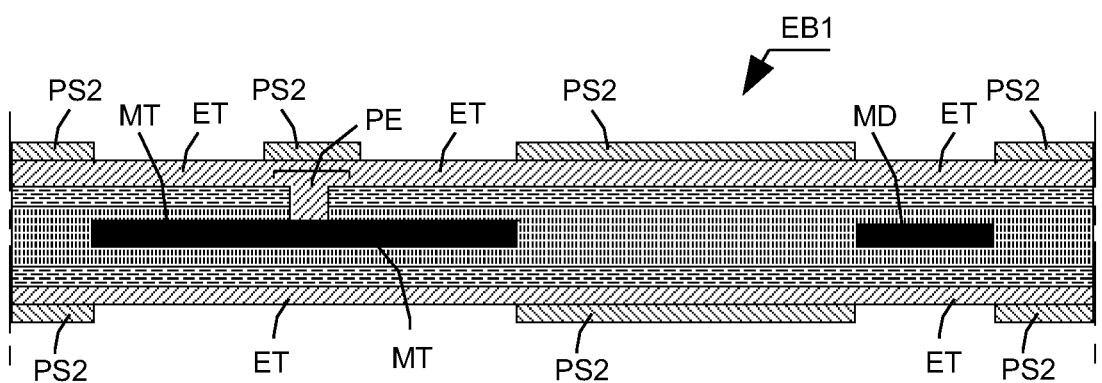

Step 10 is another photolithography step to produce the definition of the fine metal connection patterns on the upper and lower faces of the blank EB1. As shown in FIG. 10, a photoresist resin PS2 has been deposited on the upper and lower faces of the blank EB1. Next, metal portions ET that are to be removed by wet etching have been defined and the resin PS2 has been removed from these portions.

Figure 11:
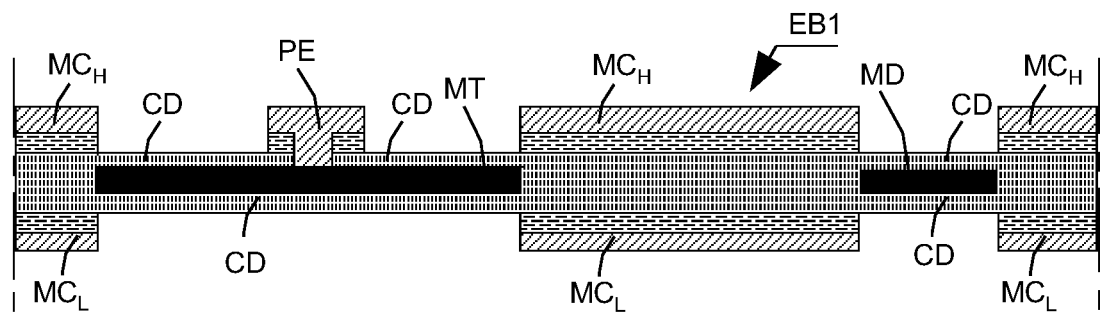

The blank EB1 following the etching in step 10 is shown in FIG. 11. As shown in FIG. 11, the removal by etching of the exposed copper portions reveals portions of the underlying dielectric layer CD. At this stage, the upper and lower metal connection patterns $MC_H$, PE and $MC_L$ of the blank EB1 have been precisely completed and defined, in particular the electrode contact block PE and the connection strip thereof (not shown). However, the upper and lower contact faces of the chips MT and MD buried in the underlying dielectric layer CD are still to be released.

Figure 12:
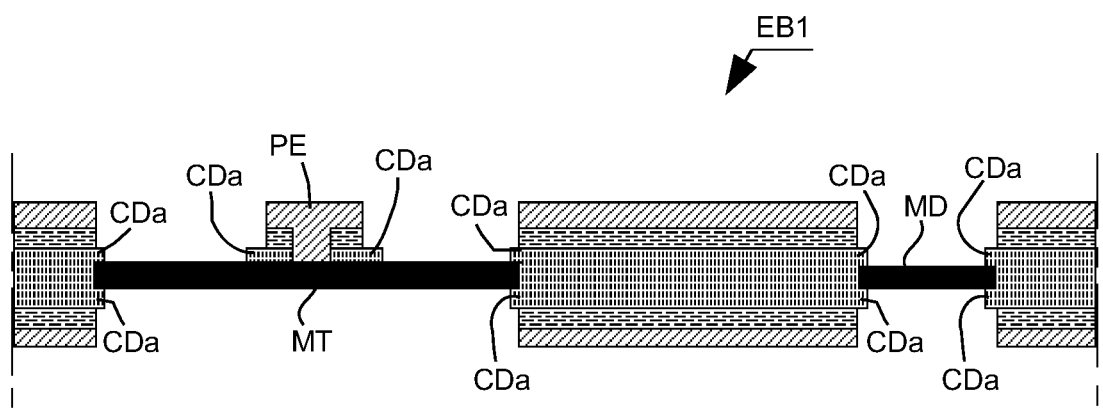

In the step in FIG. 12, the upper and lower contact faces of the chips MT and MD have been released by removal of material, for example by laser ablation. As can be seen in FIG. 12, dielectric portions CDa, originating from the layer CD, have been left on either side of the metal connection patterns and in particular of the electrode contact block PE and of the connection strip thereof.

Figure 13:
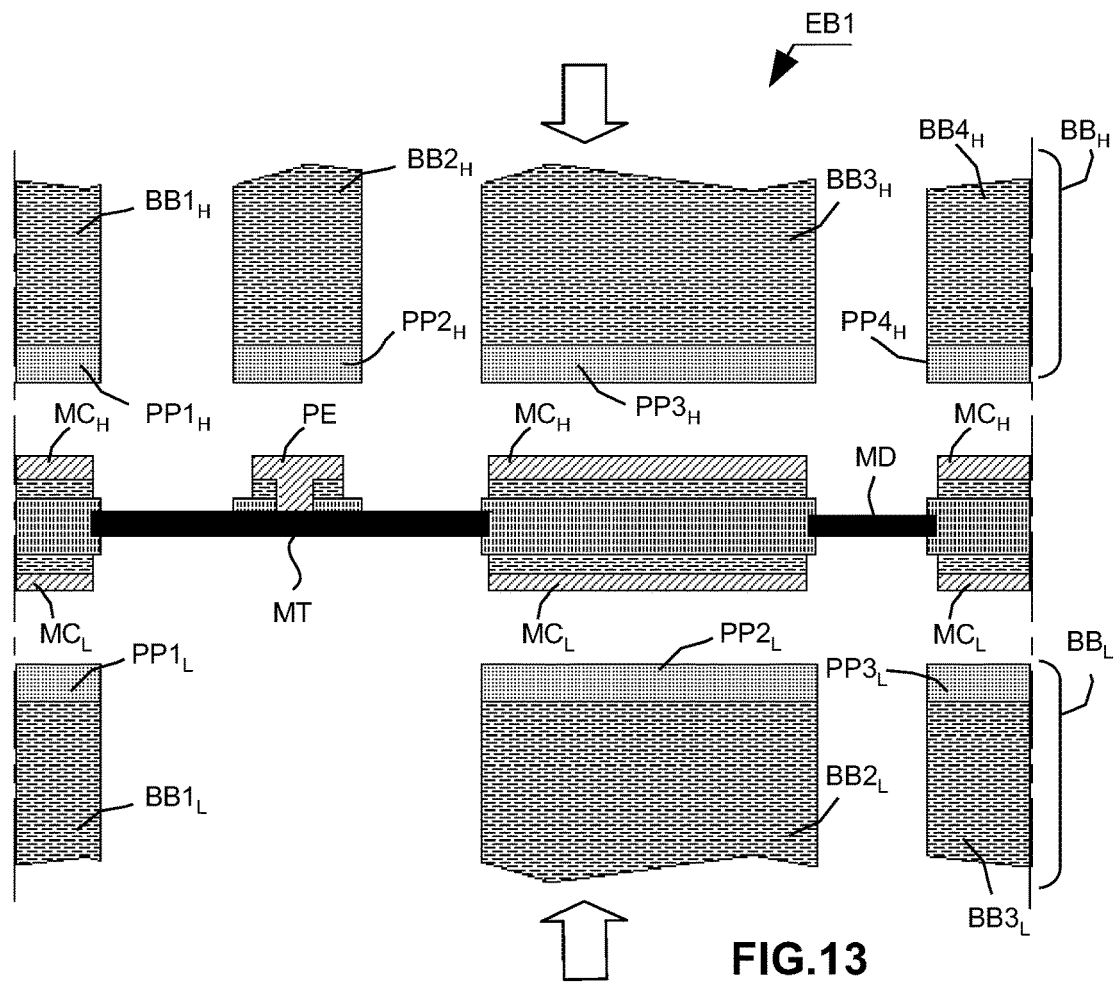
Figure 14:
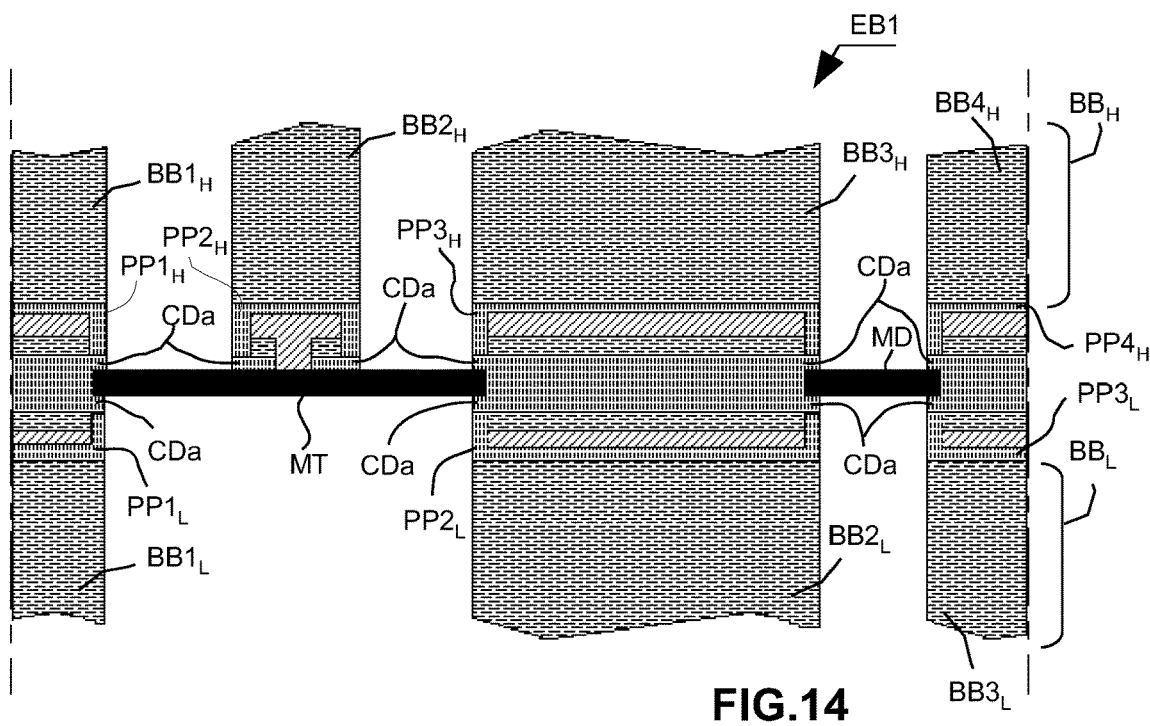
Figure 15:
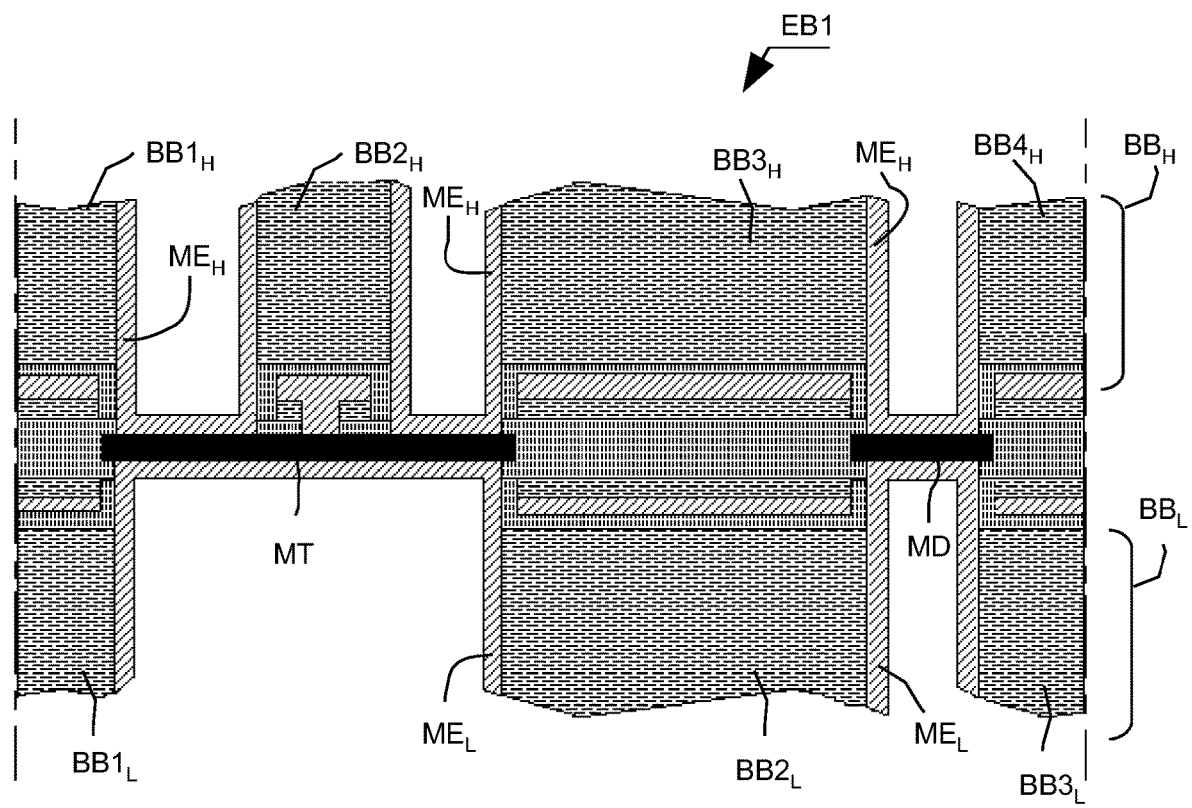

FIGS. 13 to 15 show the interconnection of the upper $BB_H$ and lower $BB_L$ bus bars to the opposite upper and lower faces of the blank EB1. As well as their usual electrical power supply or other functions, the upper $BB_H$ and lower $BB_L$ bus bars are in this case intended to form heat sinks implanted in the opposite upper and lower faces of the blank EB1. The bus bars $BB_H$, $BB_L$ are typically made of copper.

As shown in FIG. 13, the upper $BB_H$ and lower $BB_L$ bus bars are each formed of a plurality of bus segments $BB1_H$, $BB2_H$, $BB3_H$, $BB4_H$ and $BB1_L$, $BB2_L$, $BB3_L$ which have previously been cut by mechanical machining, for example, or possibly obtained by molding.

The pre-impregnated dielectric portions of step B, $PP1_H$, $PP2_H$, $PP3_H$, $PP4_H$, are transferred to the corresponding faces of bus segments $BB1_H$, $BB2_H$, $BB3_H$, $BB4_H$ for pressing onto the upper face of the blank EB1. The pre-impregnated dielectric portions of step B, $PP1_L$, $PP2_L$, $PP3_L$, are transferred to the corresponding faces of bus segments $BB1_L$, $BB2_L$, $BB3_L$ for pressing onto the lower face of the blank EB1. The dielectric portions $PP1_H$, $PP2_H$, $PP3_H$, $PP4_H$ and $PP1_L$, $PP2_L$, $PP3_L$ are provided for pressing onto the metal connection pattern portions $MC_H$, PE and $MC_L$ of the blank EB1 to cover said portions.

The blank EB1 is thus sandwiched between bus segments $BB1_H$, $BB2_H$, $BB3_H$, $BB4_H$ and $BB1_L$, $BB2_L$, $BB3_L$. The bus segments $BB1_H$, $BB2_H$, $BB3_H$, $BB4_H$ and $BB1_L$, $BB2_L$, $BB3_L$ are pressed, with the dielectric portions $PP1_H$, $PP2_H$, $PP3_H$, $PP4_H$ and $PP1_L$, $PP2_L$, $PP3_L$, against the upper and lower faces of the blank EB1 and, more specifically, against the metal connection patterns $MC_H$, PE and $MC_L$ thereof. Lamination of the assembly is typically obtained by vacuum pressing or passing through a vacuum-laminating oven.

FIG. 14 shows the state of the blank EB1 with the assembled bus segments. At this stage, the bus segments are secured mechanically to the circuit by full polymerization of the dielectric portions. The dielectric insulation patterns of the circuit are finalized at this stage. It will be noted that in this case the dielectric portions $PP1_H$, $PP2_H$, $PP3_H$, $PP4_H$ and $PP1_L$, $PP2_L$, $PP3_L$, after pressing and polymerization, are rigidly connected to the dielectric portions CDa and electrically insulate the metal connection patterns $MC_H$, PE and $MC_L$ relative to the bus bars. The thickness of the dielectric portions $PP1_H$, $PP2_H$, $PP3_H$, $PP4_H$ and $PP1_L$, $PP2_L$, $PP3_L$ is chosen so as to provide suitable electrical insulation and thermal conductivity performance.

The step in FIG. 15 is a metallization and soldering step for finalizing on the one hand the mechanical assembly and on the other hand the electrical interconnection of the upper bus segments $BB1_H$, $BB2_H$, $BB3_H$, $BB4_H$ and the upper contact faces of the chips MT, MD, and the electrical interconnection of the lower bus segments $BB1_L$, $BB2_L$, $BB3_L$ and the lower contact faces of the chips MT, MD.

It will be noted that in this case the function of the bus bar segment $BB2_H$ secured above the electrode contact block PE and the connection strip thereof is to cool the control electrode of the chip MT effectively.

As shown in FIG. 15, layers of copper $ME_H$ and $ME_L$ are deposited by electro-deposition on the upper and lower portions of the blank EB1.

The layer of copper $ME_H$ is deposited on the upper portion of the blank EB1 and interconnects the bus segments $BB1_H$, $BB2_H$, $BB3_H$ and $BB4_H$ of the bus bar $BB_H$ and the upper faces of the transistor MT and diode MD chips which correspond, for example, to drain and cathode electrodes. The layer of copper $ME_L$ is deposited on the upper portion of the blank EB1 and interconnects the bus segments $BB1_L$, $BB2_L$ and $BB3_L$ of the bus bar $BB_L$ and the lower faces of the transistor MT and diode MD chips which correspond to source and anode electrodes.

The method, as described above with reference to FIGS. 1 to 15, allows the manufacture of basic circuit bricks which may be assembled to form electronic power devices of greater or lesser complexity, using a sandwich architecture. Assembly of the basic bricks is typically carried out in a press and by passing through an oven. The mechanical and electrical connections between the two bricks are produced by soldering. It will be noted that manufacture can be carried out in parallel producing basic circuit bricks on a plurality of production lines.

The architecture of the basic circuit bricks allows direct copper contact between the heat sinks, formed by the bus bars, and the upper and lower contact faces of the electronic chips. The heat sinks formed of masses of copper situated on either side of electronic chips and in direct contact therewith allows effective heat extraction. Cooling of the control electrodes of the transistor chips is also optimized by the bus bar segments pressed against the electrodes. Moreover, the lengths of the connection conductors are minimized, which helps reduce parasitic inductances and further promotes compactness.

Figure 16:
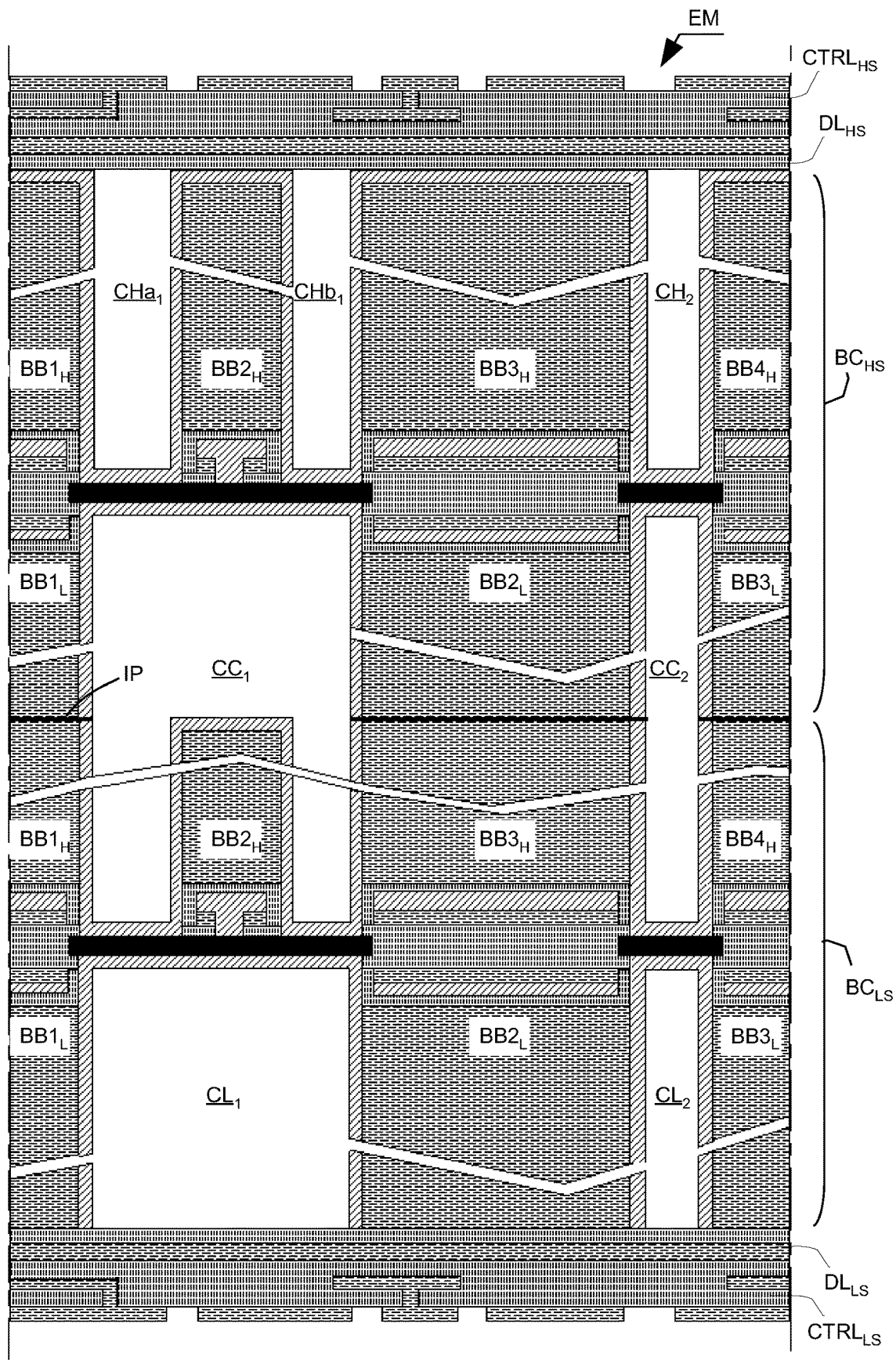
FIG. 16 is a simplified view in cross section showing a particular embodiment of an electronic power device with liquid cooling.

FIG. 16 shows a liquid-cooled electronic power device EM which is constructed by stacking two basic circuit bricks $BC_{HS}$ and $BC_{LS}$. The device EM is in this case a transistor bridge arm made up of two MOS-FET transistors and two fly-back diodes.

The two stacked basic bricks $BC_{HS}$ and $BC_{LS}$ are mechanically and electrically connected in the region of the joining plane IP by assembling the bus bars $BB_H$ and $BB_L$ to one another by the segments $BB1_L$, $BB2_L$, $BB3_L$ and $BB1_H$, $BB3_H$, $BB4_H$ thereof. Assembly may be carried out for example by transient liquid phase (TLP) soldering or by other soldering techniques.

Assembly of the basic bricks $BB_{HS}$ and $BB_{LS}$ creates central coolant circulation spaces, in this case $CC_1$ and $CC_2$, in the central portion of the device. The coolant circulation spaces $CC_1$ and $CC_2$, situated as close as possible to the electronic chips are provided for the circulation under pressure of a heat exchange coolant.

The device EM comprises control circuits $CTRL_{HS}$ and $CTRL_{LS}$ which are incorporated in the upper and lower portions of the device EM, respectively. The control circuits $CTRL_{HS}$ and $CTRL_{HS}$ are secured mechanically and insulated electrically from the upper and lower portions of basic bricks $BC_{HS}$ and $BC_{LS}$ by dielectric layers $DL_{HS}$ and $DL_{LS}$, respectively. The circuits $CTRL_{HS}$ and $CTRL_{LS}$ each comprise a plurality of laminated layers, produced according to known techniques. Active and passive components may, if necessary, be buried between the internal layers of the circuits $CTRL_{HS}$ and $CTRL_{HS}$ or alternatively implanted on the surface of the circuit in a conventional manner by brazing or conductive bonding.

As appears in FIG. 16, the incorporation in the upper and lower portions of the device EM of control circuits $CTRL_{HS}$ and $CTRL_{HS}$ with insulating dielectric layers $DL_{HS}$ and $DL_{LS}$ allows upper and lower coolant circulation spaces $CHa_1$, $CHb_2$, $CH_2$ and $CL_1$, $CL_2$ to be formed. The spaces $CHa_1$, $CHb_2$, $CH_2$ and $CL_1$, $CL_2$ situated on either side of the central spaces $CC_1$ and $CC_2$ help increase the cooling of the device EM. The electronic chips are therefore cooled more effectively by the circulation of a heat exchange liquid close to the upper and lower faces thereof and to the control electrodes.

Other embodiments of electronic power devices according to the invention are of course possible. Thus, for example, the upper portion and/or the lower portion of the device EM could be closed simply with a dielectric layer, without necessarily implanting a control circuit at this position. Alternatively, the lower portion of the device EM could remain open, for air cooling, the slotted profile of the bus bar providing an increased heat exchange area.

The invention is not limited to the particular embodiments which have been described here by way of example. A person skilled in the art, depending on the applications of the invention, may produce different modifications and variants which fall within the scope of the appended claims.

The invention claimed is:

1. An electronic power circuit comprising at least an electronic chip, a laminated substrate formed of insulating and conductive layers and thermal dissipation means, said electronic chip being implanted in said substrate and said thermal dissipation means being secured to opposite first and second faces of said substrate, said thermal dissipation means comprising heat-sink-forming first and second bus bars mounted respectively on said opposite first and second faces of said substrate, said first and second bus bars each being formed of a plurality of metal bus bar segments secured at predetermined spaced-apart positions; and said bus bar segments of each bus bar being interconnected with each other and with a contact face of said electronic chip by a layer of metal.

2. The electronic power circuit according to claim 1, wherein said bus bar segments are secured to said first and second opposite faces of said substrate through respective dielectric layers.

3. The electronic power circuit according to claim 1, wherein at least one of said bus bar segments is secured to an electrode of said chip through a dielectric layer.

4. The electronic power circuit according to claim 1, wherein said bus bar segments and said conductive layers and said layers of metal are made of copper.

5. An electronic power device, wherein said electronic power device comprises at least two circuits according to claim 1, a first 'high side' circuit being stacked on a second 'low side' circuit, said high side and low side circuits being connected mechanically and electrically by their respective bus bar segments, and in that it comprises at least one central coolant circulation space which is situated between said high side and low side circuits, said central coolant circulation space being formed between said bus bar segments.

6. The electronic power device according to claim 5, wherein said electronic power device also comprises at least an upper coolant circulation space which is situated in an upper portion of the device, said upper coolant circulation space being formed between bus bar segments of an upper bus bar of an upper circuit and an upper dielectric layer.

7. The electronic power device according to claim 5, wherein said electronic power device also comprises at least one lower coolant circulation space which is situated in a lower portion of the device, said lower coolant circulation space being formed between respective bus bar segments of a lower bus bar of a lower circuit and a lower dielectric layer.

8. The electronic power device according to claim 5, wherein said electronic power device comprises at least one control circuit secured to an upper portion or a lower portion of the device through a respective dielectric layer.

9. A method of incorporating electronic power chips and heat-sink-forming bus bars to produce the electronic power circuit according to claim 1, wherein said method comprises:
    producing a blank incorporating at least one electronic chip comprised between internal laminated insulating and/or conductive layers;
    mechanically attaching, by means of dielectric portions of resin prepreg, metal bus bar segments at predetermined spaced-apart positions on opposite upper and lower faces of the blank; and
    for each of the opposite upper and lower faces, interconnecting by metal layer deposition of said bus bar segments secured to a face in question and a respective contact face of said electronic chip, thus forming said electronic power circuit comprising heat-sink-forming bus bars.

10. The method according to claim 9, wherein said method comprises steps of lamination and removal of insulating and conductive materials by ablation, electro-deposition and photolithography.

* * * * *